(12) United States Patent
Ranade et al.

(10) Patent No.: US 9,139,908 B2
(45) Date of Patent: Sep. 22, 2015

(54) GRADIENT THIN FILMS

(71) Applicant: The Boeing Company, Chicago, IL (US)

(72) Inventors: Alpana Ranade, Bellevue, WA (US); Marvi A. Matos, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/104,796

(22) Filed: Dec. 12, 2013

(65) Prior Publication Data

US 2015/0167170 A1    Jun. 18, 2015

(51) Int. Cl.
*C23C 16/50* (2006.01)

(52) U.S. Cl.
CPC ...................... *C23C 16/50* (2013.01)

(58) Field of Classification Search
USPC ...................... 428/212; 427/249.15
See application file for complete search history.

(56) References Cited

U.S. PATENT DOCUMENTS

| 4,414,085 | A | * | 11/1983 | Wickersham et al. ... 204/192.15 |
| 4,842,937 | A | * | 6/1989 | Meyer et al. ................. 428/408 |
| 6,217,719 | B1 | | 4/2001 | Kanazawa |
| 6,297,521 | B1 | * | 10/2001 | Forbes et al. ................... 257/77 |
| 6,852,920 | B2 | | 2/2005 | Sager |
| 6,881,475 | B2 | * | 4/2005 | Ohtani et al. ................. 428/216 |
| 6,962,751 | B2 | * | 11/2005 | Fukui et al. ................... 428/408 |
| 8,099,792 | B1 | | 1/2012 | Hersam |
| 8,269,100 | B2 | | 9/2012 | Darling |
| 8,574,715 | B2 | * | 11/2013 | Ito et al. ........................ 428/408 |
| 2005/0118504 | A1 | | 6/2005 | Honda |
| 2005/0257827 | A1 | | 11/2005 | Gaudiana |
| 2005/0268962 | A1 | | 12/2005 | Gaudiana |
| 2009/0188558 | A1 | | 7/2009 | Jen |
| 2009/0229667 | A1 | | 9/2009 | Shrotriya |
| 2009/0301550 | A1 | | 12/2009 | Hunt |
| 2010/0078066 | A1 | | 4/2010 | Darling |
| 2010/0279027 | A1 | | 11/2010 | Pingree |
| 2011/0168549 | A1 | | 7/2011 | Roustaei |
| 2011/0253217 | A1 | | 10/2011 | Grossman |
| 2012/0024380 | A1 | | 2/2012 | Feldman-Peabody |
| 2012/0048368 | A1 | | 3/2012 | Chaudhary |
| 2012/0273732 | A1 | | 11/2012 | Jenekhe |

FOREIGN PATENT DOCUMENTS

DE           10392855 T5      9/2005
DE       102008028540      * 12/2009

(Continued)

OTHER PUBLICATIONS

Babich et al "A Novel Graded Antireflective Coating with Built-in Hardmask Properties Enabling 65nm and Below CMOS Device Patterning" IEEE International Electron Device Meeting (2003) p. 28.5-1 through 28.5-4.*

(Continued)

*Primary Examiner* — Archene Turner
(74) *Attorney, Agent, or Firm* — Christopher J. Knors; Moore & Van Allen PLLC

(57) ABSTRACT

An article comprising a thickness of a first film from a surface of the article, the first film having a gradient chemical composition within at least a portion of the thickness of the first film in a vertical and/or horizontal direction relative to the surface of the article, and methods and systems for producing same.

13 Claims, 8 Drawing Sheets

(56) References Cited

FOREIGN PATENT DOCUMENTS

| | | | |
|---|---|---|---|
| EP | 718418 | * | 6/1996 |
| EP | 1895021 A1 | | 3/2008 |
| EP | 2145977 A2 | | 1/2010 |
| EP | 2194162 A2 | | 6/2010 |
| GB | 1117009 A | | 6/1968 |
| JP | 11-124693 A | | 5/1999 |
| WO | 95/12693 | * | 5/1995 |
| WO | WO01/24250 A1 | | 4/2001 |
| WO | WO 01/46324 A2 | | 6/2001 |
| WO | WO2007067242 A1 | | 6/2007 |
| WO | WO2009073862 A1 | | 6/2009 |
| WO | WO2009114832 A2 | | 9/2009 |
| WO | WO2010039634 A1 | | 4/2010 |
| WO | WO2010049512 A1 | | 5/2010 |
| WO | WO2010100345 A1 | | 9/2010 |
| WO | WO2010102178 A2 | | 9/2010 |
| WO | WO2011016839 A1 | | 2/2011 |
| WO | WO2011045253 A1 | | 4/2011 |
| WO | WO2011051292 A1 | | 5/2011 |
| WO | WO2012031083 A2 | | 3/2012 |
| WO | WO2012072271 A1 | | 6/2012 |

OTHER PUBLICATIONS

English translation of DE102008028540.*
Barankin, M. D.; Gonzalez II, E.: Ladwig, A. M.; Hicks, R. F. (2007). Plasma-enhanced chemical vapor deposition of zinc oxide at atmospheric pressure and low temperature. Solar Energy Materials and Solar Cells, 91, pp. 924-930.
Chang, K.-M.; Huang, S.-H.: Wu, C.-J.; Lin, W.-L.; Chen, W.-C.; Chi, C.-W.; Lin, J.-W.; Chang, C.-C. (2011). Transparent conductive indium-doped zinc oxide films prepared by atmospheric pressure plasma jet. Thin Solid Films, 519. pp. 5114-5117.
Chung, Yi-Wen; Fang, Huang-Sheng; Lee, Jian-Hong; Tsai, Chih-Jen (2010) Fabrication of flexible thin film with pattern structure and macroporous array consisting of nanoparticles by electrophoretic deposition Japanese Journal of Applied Physics, 49 (6, Pt. 2), pp. 06GH11/1-06GH11/4.
Dagkaldiran, U., Gordijn, A., Finger, F., Yates, H.M., Evans, P., Sheel, D.W., Remes, Z., Vanecek, M.(2009). Amorphous silicon solar cells made with SnO2:F TCO filmsdeposited by atmospheric pressure CVD. Materials Science and Engineering B. pp. 6-9.
Escribano, J. A.; Gonzalo-Juan, I.; Sanchez-Herencia, A. J.; Ferrari, B. (2012) AFM characterization of the nanoparticles arrangement by electrophoretic deposition. Key Engineering Materials, Issue: Electrophoretic Deposition: Fundamentals and Applications IV, 507, pp. 61-66.
Hu, J., Gordon, R.G. (1992). Textured aluminum-doped zinc oxide thin films from atmospheric pressure chemical vapor deposition. Journal of Applied Physics, pp. 880-890.
Ivosevic et al., "Solid Particle Erosion Resistance of Thermally Sprayed Functionally Graded Coatings for Polymer Matrix Composites," Surface & Coatings Tecnology, 2006, pp. 5145-5151.
J. Richards, K. Weigandt and D.C. Pozzo (2011) Aqueous Dispersions of Colloidal Poly(3-hexylthiophene) Gel Particles with High Internal Porosity, J. Colloid and Interface Science, 364, 341.
Jolivet, J.-P.; Cassaignon; S.; Chaneac, C.; Chiche, D.; Durupthy, O.; Portehault, D. (2010). Design of metal oxide nanoparticles: Control of size, shape, crystalline structure and functionalization by aqueous chemistry, Comptes Rendu Chimie, 13, pp. 40-51.
K. Lee et al: "Air-Stable Polymer Electronic Devices", Advanced Materials, vol. 19, No. 18, Aug. 9, 2007, pp. 2445-2449.

Kobayashi, N. P.; Kobayashi, J. T.; Zhang, X.; Dapkus, P. D.; Rich, D. H. (1999). Epitaxial lateral overgrowth of GaN over AlOx surface formed on Si substrate. Applied Physics Letters, 74, pp. 2836-2838.
Krebs, F., (2009). Fabrication and processing of polymer solar cells: A review of printing and coating techniques. Solar Energy Materials and Solar Cells. pp. 394-412.
Kuwahara, K.; Itagaki, N.; Nakaharam, K.; Yamashita, D.; Uchida, G.; Kamataki, K.; Koga, K.; Shirantani, M. (2012). High quality epitaxial ZnO films grown on solid-phase crystallized buffer layers. Thin Solid Films. 520, pp. 4674-4677.
Ladwig, A. M., Koch, R. D., Wenski, E. G., & Hicks, R. F. (2009). Atmospheric plasma deposition of diamond-like carbon coatings. Diamond & Related Materials , pp. 1129-1133.
Li, Gang; Rui, Zhu and Yang Yang. "Polymer solar cells," Nature Photonics Focus Review Artices, Feb. 29, 2012, pp. 153-161.
Li, Jianjun; Zhang, Xingtang; Chen, Yanhui; Li, Yuncai; Huang, Yabin; Du, Zuliang; Li, Tiejin(2005) Synthesis of highly ordered SnO2/Fe2O3 composite nanowire arrays by electrophoretic deposition method, Chinese Science Bulletin, 50 (10), pp. 1044-1047.
Lugscheider et al., "Mechanical Properties of Thermal Sprayed Coatings on CFRP," Proceedings of the 5th National Thermal Spray Conference, Jun. 1993, pp. 569-573.
Lugscheider et al., "Thermal Sprayed Coatings for Carbon Reinforced Plastices—Research, Development and Applications," pp. 28-31.
Narayan, Roger J., "Adhesion Properties of functionally Gradient Diamond Composite Films on Medical and Tool Alloys," J. Adhesion Sci. Technol., vol. 18, No. 12, 2004. pp. 1339-1365.
Robitaille et al., "Metallic Coating of Aerospace Carbon/Epoxy Composites by the Pulsed Gas Dynamic Spraying Process," Surface & Coatings Technology, 2009, pp. 2954-2960.
Sailer, R. A., Wagner, A., Schmit, C., Klaverkamp, M., & Schulz, D. L. (2008). Deposition of transparent conductive indium oxide by atmospheric-pressure plasma jet. Surface & Coatings Technology , pp. 835-858.
Scopece, P., Viaro, A., Sulcis, R., Kulyk, I., Patelli, A., & Guglielmi, M.(2009). SiOx-based gas barrier coatings for polymer substrates by atmospheric pressure plasma jet deposition. Plasma Processes and Polymers , pp. S705-S710.
Shrotriya, V.; Li, G.; Yao, Y.; Chu, C.-W.; Yang, Y. (2006). Transition metal oxides as the buffer layer for polymer photovoltaic cells, Applied Physics Letters, 88, pp. 073508-073508-3.
Sturgeon, et al., "Cold Sprayed Coatings for Polymer Composite Substrates," Proc. of the 10th ISMSE & the 8th ICPMSE, Colliore, France, Jun. 2006, pp. 1-5.
T.L. Sounart, J. Liu, J. A. Voigt, J.W.P. Hsu, E.D. Spoerke, Z. Tian, and Y. Jiang(2006) Sequential Nucleation and Growth of Complex Nanostructured Films, Advanced Funtional Materials, 16, pp. 335-344.
Yang, Shikuan; Xu, Jingjing; Wang, Zhenyang; Zeng, Haibo; Lei, Yong,(2011) Janus particle arrays with multiple structural controlling abilities synthesized by seed-directed deposition. Journal of Materials Chemistry; 21(32), pp. 11930-11935.
Verplanck et al., "Wettability Switching Techniques on Superhydrophobic Serfaces," Nanoscale Res Lett (2007), pp. 577-596.
Deval, et al., "Reconfigurable Hydrophobic/Hydrophilic Surfaces in Microelectromechanical Systems (MEMS)," Journal of Micromechanics and Microengineering, Oct. 14, 2003; pp. 91-95.
European Patent Office, International Application No. PCT/US2014/056467, International Search Report and Written Opinion dated Feb. 11, 2015; 9 pages.

* cited by examiner

| | process parameters | | | | | | | | | chemical | physical |
|---|---|---|---|---|---|---|---|---|---|---|---|
| Sample | Power | O2 Flow | Bubbler Flow | Dilution Flow | Speed | Distance | PreCursor Temp | PreTreat | Num passes | | thickness |
| 8 | 130 | 0.55 | 1.5 | 1.5 | 75 | 5 | 30 | pt0 | 25 | OMCTS | 220 |
| 28 | 90 | 0.2 | 1.5 | 0.5 | 25 | 5 | 50 | pt0 | 25 | OMCTS | 530 |
| ML_8,4 | 130 | 0.55 | 1.5 | 1.5 | 75 | 5 | 30 | pt0 | 25 | OMCTS | - |
| | 90 | 0.2 | 0.5 | 1.5 | 75 | 5 | 30 | pt0 | 25 | OMCTS | 310 |
| ML_10 | 90 | 0.2 | 1.5 | 0.5 | 25 | 5 | 50 | pt0 | 25 | OMCTS | - |
| | 130 | 0.55 | 1.5 | 0.5 | 25 | 5 | 30 | - | 18 | OMCTS | 430 |

| | process parameters | | | | | | | | | | physical |
|---|---|---|---|---|---|---|---|---|---|---|---|
| Sample | Power | O2 Flow | Bubbler Flow | Dilution Flow | Speed | Distance | PreCursor Temp | PreTreat | Num passes | | thickness |
| 12 | 120 | 0.2 | 0.5 | 0.5 | 25 | 5 | 30 | pt0 | 20 | TMCTS | 4580 |
| 19 | 120 | 0.35 | 1.5 | 0.5 | 75 | 5 | 10 | pt0 | 20 | TMCTS | 2830 |
| ML_1 | 120 | 0.35 | 1.5 | 1.5 | 40 | 5 | 10 | pt0 | 8 | TMCTS | - |
| | 120 | 0.2 | 0.5 | 1.5 | 40 | 5 | 10 | - | 8 | TMCTS | 2360 |
| ML_3 | 110 | 0.1 | 1.5 | 1.5 | 40 | 5 | 10 | pt0 | 8 | TMCTS | |
| | 110 | 0.35 | 1.5 | 1.5 | 25 | 5 | 30 | pt0 | 16 | OMCTS | 2300 |

| | optical | | | | | | | | | | | |
|---|---|---|---|---|---|---|---|---|---|---|---|---|
| | clarity | haze | clarity | | | | haze | | | | clarity | haze |
| Sample | initial | initial | falling sand (1kg) | falling sand (3kg) | falling sand (5kg) | falling sand (7.5kg) | falling sand (1kg) | falling sand (3kg) | falling sand (5kg) | falling sand (7.5kg) | taber abrasion (1k) | taber abrasion (1k) |
| 8 | 100.0 | 0.5 | 99.5 | 97.4 | 93.5 | 93.4 | 3.5 | 8.1 | 12.9 | 14.1 | 99.3 | 2.0 |
| 28 | 100.0 | 0.8 | 99.6 | 98.7 | 97.2 | 93.5 | 3.0 | 5.8 | 8.2 | 11.2 | 99.4 | 3.6 |
| ML_8,4 | 99.9 | 0.5 | 99.5 | 98.2 | 94.3 | 92.4 | 3.6 | 5.2 | 11.9 | 13.5 | 99.5 | 1.1 |
| ML_10 | 100.0 | 0.7 | 99.6 | 98.7 | 97.2 | 93.6 | 3.6 | 6.8 | 9.1 | 12.9 | 99.6 | 1.3 |

| | optical | | | | | | | | | | | |
|---|---|---|---|---|---|---|---|---|---|---|---|---|
| | clarity | haze | clarity | | | | haze | | | | clarity | haze |
| Sample | initial | initial | falling sand (1kg) | falling sand (3kg) | falling sand (5kg) | falling sand (7.5kg) | falling sand (1kg) | falling sand (3kg) | falling sand (5kg) | falling sand (7.5kg) | taber abrasion (1k) | taber abrasion (1k) |
| 12 | 94.5 | 6.5 | 89.7 | 85.8 | 85.9 | 80.2 | 12.0 | 16.4 | 20.6 | 29.4 | 82.2 | 18.5 |
| 19 | 96.4 | 4.9 | 84.7 | 71.8 | 66.8 | 51.3 | 19.9 | 46.6 | 65.2 | 71.5 | 77.1 | 23.9 |
| ML_1 | 94.4 | 4.4 | 86.0 | 79.9 | 70.7 | 68.4 | 13.1 | 27.5 | 41.3 | 40.6 | 81.6 | 21.7 |
| ML_3 | | | 87.2 | 79.4 | 68.9 | 59.3 | 17.8 | 34.5 | 41.3 | 60.2 | 85.7 | 19.5 |

FIG. 8

GRADIENT THIN FILMS

TECHNICAL FIELD

An article comprising a thickness of a first film from a surface of the article, the first film having a gradient chemical composition within at least a portion of the thickness of the first film in a vertical and/or horizontal direction relative to the surface of the article, and methods and systems for producing same.

BACKGROUND

Film deposition techniques can be used to create thin films on a variety of substrates. Previously, high performance films have been created using vacuum techniques such as PECVD or magnetron sputtering. However, large or contoured parts are difficult to coat using a vacuum chamber. In addition, vacuum deposition processes require large amounts of capital investment to acquire and assemble the vacuum chamber components.

SUMMARY

In a first aspect, a method for making multi-layer gradient composition thin films is provided. The method comprises introducing at least one chemical precursor into a plasma; depositing a thickness of a first film to a surface of a substrate, the first film having a chemical composition derived from at least one chemical precursor; modifying at least one plasma-related process parameter related to depositing at least one chemical precursor during the deposition of a thickness of a first film; varying the chemical composition of at least a portion of the thickness of the first film, independently or in combination, in a vertical direction or a vertical and horizontal direction relative to the substrate.

In another aspect, a system for depositing films having a chemical gradient is provided. The system comprises an atmospheric plasma device configured for producing a plasma; one or more plasma-source gases configurable to the atmospheric plasma device; one or more precursor sources configurable to the atmospheric plasma device; and, optionally, one or more shielding gas sources configurable to the atmospheric plasma device.

In another aspect, an article is provided. The article comprises a thickness of a first film from a surface of the article; the first film comprising a gradient chemical composition, independently or in combination, in a vertical direction or a vertical and horizontal direction relative to the surface of the article within at least a portion of the thickness of the first film.

BRIEF DESCRIPTION OF THE DRAWINGS

FIG. 8 depicts a summary of process parameters, physical parameters and optical and mechanical properties of deposited film samples of an aspect of the present method.

DETAILED DESCRIPTION

Figure 1:
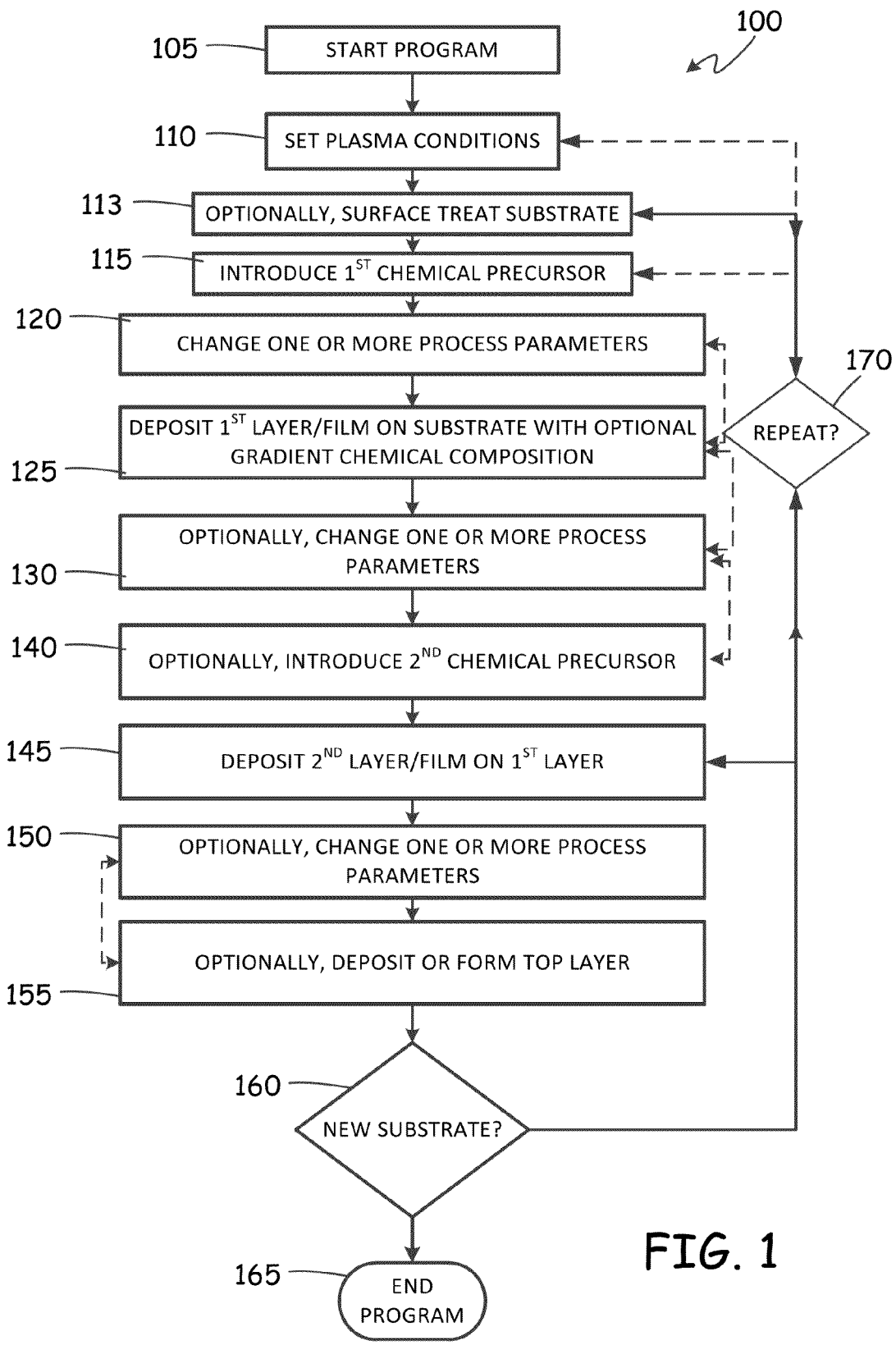
FIG. 1 depicts an exemplary flowchart of an aspect of the present method disclosed herein.

The present disclosure provides, among other things, a method of optimizing the mechanical properties of deposited thin-film coatings. The method provides the design and creation of multi-layer films with gradually changing (e.g., gradient) mechanical properties and/or chemical compositions. The present disclosure further provides multi-layer-gradient structures with unique mechanical properties. In one aspect, multi-layer-gradient constructs are prepared using atmospheric plasma deposition. Control of one or more process conditions during thin film deposition can provide for new or improved properties such as transparency, erosion resistance, wear resistance, or elasticity.

DEFINITIONS

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer or film, region or substrate is referred to as being "deposited on" or "deposited onto" another element, it can be directly deposited on or deposited onto the other element, or intervening elements may also be present. In contrast, when an element is referred to as being "directly deposited on" or "directly deposited onto" another element, there are no intervening elements present.

Relative terms such as "below" or "above" or "upper" or "lower" or "horizontal" or "vertical" or "top" or "bottom" can be used herein to describe a relationship of one element, layer/film or region to another element, layer/film or region as illustrated in the figures. It will be understood that these terms are intended to encompass different orientations of the device in addition to the orientation depicted in the figures.

The terminology used herein is for the purpose of describing particular aspects only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, steps, operations, elements, and/or components, but do not preclude the presence or addition of one or more other features, steps, operations, elements, components, and/or combinations thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

Unless otherwise expressly stated, "coating" is inclusive of one or more "thin films" or layers, e.g., plasma deposited thin films or layers. A coating, as that term is used herein, can comprise a monolayer (single atomic layer) up to about 1 micron in thickness and/or one or more layers having a thickness from about 1 micron to a few hundred microns.

As used herein, the term "erosion" is inclusive of one or more of a chemical and mechanical effect to a surface or surface layer film e.g., where chemicals and/or small particles such as raindrops or sand impinge and wear away the surface material and where the extent of effect is related to thickness, hardness, and toughness of the material comprising the surface.

As used herein, the term "abrasion" is inclusive of surface effect e.g., scratching, scuffing, marring, or wearing down, that can be caused by interaction with a second, hard or harder, or rougher surface (such as sandpaper) resulting in abrading of the surface. In the case of abrasion, the extent of effect is related to the hardness of the contacting surfaces, where hardness of a thin film can be determined by indentation techniques that can determine modulus (elastic modulus and/or Young modulus).

As used herein, the term "spatially" is inclusive of a separation or gradient in the vertical or horizontal direction. In one aspect, "spatially" is inclusive of a deposited film having a continuous, semi-continuous, or stepped-like chemical composition gradient, as well as two or more deposited films on a surface of a substrate, the two or more deposited films being discernible as to their chemical composition in one or more directions. When spatially arranged, the gradient films can be multi-dimensionally disposed on the substrate and provide improvement to the film and/or the substrate.

The term "substrate" as used herein is inclusive of an object having a flat or irregular surface or contour such as a curved surface. The substrate can have one or more edges and/or sides. In one aspect, "substrate" is inclusive of one or more surfaces of an object. Substrates include inorganic materials, organic materials, inorganic-organic materials, such as semiconductors, metals, plastics, ceramics, glasses, etc. In certain aspects, the terms "substrate" and "article" can be used interchangeably with regard to the deposition of the gradient film(s) to one or more of their respective surfaces.

The term "about" as used herein is inclusive of, independently, +/−10%, of the stated value unless otherwise indicated.

Polymeric materials such as polycarbonate and stretched acrylic are used in aircraft windows and canopies. However, these materials are susceptible to effects in the form of scratches and pits, affecting their physical appearance and transparency. Currently, solution processing techniques are used to generate coatings that improve material resistance to undesirable effects. Although there are erosion resistant commercial coatings in the market, these are not necessarily ideal solutions to use due to a variety of factors such as cost, ease of application, or adhesion to polymeric substrates. Presently described atmospheric plasma films provide a solution for the deposition of durable films that adhere to substrates such as polycarbonate and stretched acrylic as well as for other materials such as metals, ceramics, and composites. Films created using atmospheric plasma are erosion and abrasion resistant and can extend the lifetime of polymers subject to erosion and abrasion conditions, among other things.

Disclosed herein are methods to achieve new or improved mechanical properties of multi-layer films by gradually changing properties, rather than attempting to provide the desired mechanical properties in a single layer film coating. In addition, if parts that must be coated vary spatially, then one type of film or one continuous film may not have the optimal properties for each section.

Therefore, the presently disclosed methods provide automation that is coupled with deposition techniques for tailoring a single or multi-layer film for specific locations on a substrate and/or the entire substrate. The presently disclosed methods of deposition can be used to create films of specific elemental compositions or elemental compositional-makeup such as silicon-oxy-carbide, zinc oxide, nitride coatings, or diamond like carbon films, all of which find applications in the aerospace industry and other industries to increase the lifetime of components, reduce weight, and/or add a specific surface functionality such as conductivity. In one aspect, the present disclosure provides for the deposition of multi-layer films that incorporates layers of different materials and allows for the preparation of surfaces with multifunctional properties.

The presently disclosed methods also provide for the preparation of "thin" or "thick" films of one or more materials and/or compositions. A thin film would include one or more layers collectively having a thickness of about 10 Angstroms to about 1000 nanometers. "Thick" in this context is a film or coating of average thickness between about 1 micron to about 1000 microns. There can be some overlap in thickness between what is referred to as a thin and a thick film without deviating from the scope of the claims. By creating thick films, an increase in the erosion resistance of the underlying substrate, e.g., polymer substrates, is improved and/or other properties are provided or improved, such as moisture or oxygen barrier functionality, conductivity, optical properties, etc. In another aspect, the presently disclosed methods provide films with good erosion and abrasion resistance, by creating multilayer/gradient thin films. In one aspect, a thick film provides good adhesion to the polymer and the gradient layer architecture allows for a gradual change in mechanical properties throughout at least a portion of the multilayer/gradient thin film. In another aspect a hard top layer/film can then be formed on at least a portion of the multilayer/gradient thin film to provide abrasion resistance. The "harder" top layer/film may be of modulus at least 5 percent greater than the bulk, as measured by indentation techniques, for example.

Conventional techniques require very long deposition/cure times to create thick films or require the use of a vacuum chamber. Such thick, single films may only provide optimization of one property and not the other (for instance, optimal erosion resistance but with insignificant or absent abrasion resistance). Therefore, the present disclosure provides for a multi-layer or gradient film with a balance of properties that is created in open air. In one aspect, the presently disclosed method uses atmospheric plasma deposition techniques. Atmospheric plasma deposition has several advantages. Atmospheric plasma deposition does not require a "vacuum chamber" in the conventional sense, and therefore atmospheric plasma deposition provides for a mobile and/or robotic-like plasma source. Atmospheric plasma deposition provides for a plasma head capable of scanning and/or rastering over all or a portion of a substrate and can therefore provide methods of coating parts of different shapes and surface contours. In contrast, conventional techniques cannot generally be used without employing a vacuum, nor can they be easily adapted to or configured for creating spatially varying and/or chemically gradient multi-layer films, nor are conventional techniques adapted for depositing films and/or coatings on complex or heavily contoured shapes. Typically, conventional deposition techniques require that substrates to be coated be placed on a support structure in a vacuum deposition chamber, and/or require mask-techniques to modify the nature and composition of the film deposited on a surface. Other conventional methods (i.e. flow coating) require long cure/dry times in addition to significant solvent use and do not easily allow for the creation of spatially varying films. Conventional deposition techniques are not automatable, portable and/or configured for robotics (multi-axis coating processes). By way of example, atmospheric plasma deposition provides for integration of the plasma head with a robotic system that can be multi-axis, e.g., six-axis. Using the systems and methods disclosed herein, creation of spatially gradient films, which is not possible and/or practical using conventional techniques, is provided. In one aspect, a conveyer-system or multi-axis robot can be employed to position and/or translate the atmospheric plasma head. The presently disclosed method provides for depositing thin films upgrading composition with smooth material/composition transitions. Such methods prevent or eliminate stepped transitions of deposit material with abrupt changes at the interfaces between the different materials, and instead provide a controlled gradient. Variations can be made in any direction relative to the surface being deposited on. Gradual changes (gradient) as opposed to stepped transitions have been shown to provide better adhesion and less stress in comparison to non-similar material interfaces, thus avoiding a source of imperfections or inconsistency within the deposited film. Thus, in one aspect, the presently disclosed methods provides for preparing a surface (substrate) having improved compatibility of subsequent coatings deposited thereon at specific locations and/or regions of the substrate.

In one aspect of the present disclosure, changing the deposition parameters of the film or the chemical precursors over each successive layer is provided. By changing the deposition parameters, a film and/or coating with graded or gradient mechanical properties is provided. Such films and/or coatings with graded or gradient mechanical properties can be tailored to provide new or improved erosion and abrasion resistance to substrates lacking such properties, such as plastics, glass, and the like. The presently disclosed method and films prepared therefrom can be deposited on "temperature sensitive" substrates, such as polymers, due to the relatively low temperature experienced at the surface of the substrate during the deposition process. External cooling, e.g., gas or fluid cooling and/or heat transfer from substrate, can be provided if needed.

The presently disclosed methods and films prepared therefrom can also provide advantages and benefits in electronic devices, such as touch screens, smart phones, etc. The presently disclosed methods can also be used to "bio-functionalize" medical implants, or to provide abrasion-resistant transparent polymeric articles e.g., automotive headlight covers, windshields, etc.

As shown in FIG. 1, process flowchart diagram 100 is depicted having a start program function step 105 that would include the step 110 of setting plasma conditions. Optional Step 113 provides for preparation of the substrate surface, for example, using pure oxygen plasma or combination of gases to clean and/or functionalize at least a portion of the surface of the substrate. Step 115 provides for the introduction of a first chemical precursor described below, whereas steps 120, 125 and 130 provide for the changing of one or more process parameters and the deposition of a first gradient layer/film (hereinafter "layer" or "coating") on a substrate, the first layer having a continuous, semi-continuous, or stepped-like gradient chemical composition provided by the same or different chemical precursor or precursors, with the option of changing one or more process parameters during and/or after deposition of the first layer. By way of example, "process parameters" include one or more of plasma-related parameters or process controls such as plasma power or oxygen flow rate, the position and/or distance of the plasma head relative to the substrate, the velocity and/or acceleration of the plasma head during deposition, the flow rate of the one or more chemical precursor materials, and the like. Steps 140, 145, and 150 include the introduction of a second chemical precursor and the deposition of a second layer on the first layer, the second layer having a continuous, semi-continuous, or stepped-like gradient chemical composition provided by the same or different chemical precursor and/or precursors that may be the same or different chemical precursors of the first layer, with the option of changing one or more process parameters before, during, or after commencing deposition of the second layer. In one aspect, the second chemical precursor is identical to the first chemical precursor, however, the deposition of the second chemical precursor takes place using different deposition parameters to provide for the gradient chemical composition of the subsequently deposited film. Step 155 includes the deposition or the formation of a "top layer" on the subsequently deposited multi-layer film. This layer can be used to provide additional functionality, or to thermodynamically or chemically stabilize the multi-layer composite. Steps 160, 165, and 170 provide for continuous operation of the method and/or termination.

Figure 2:
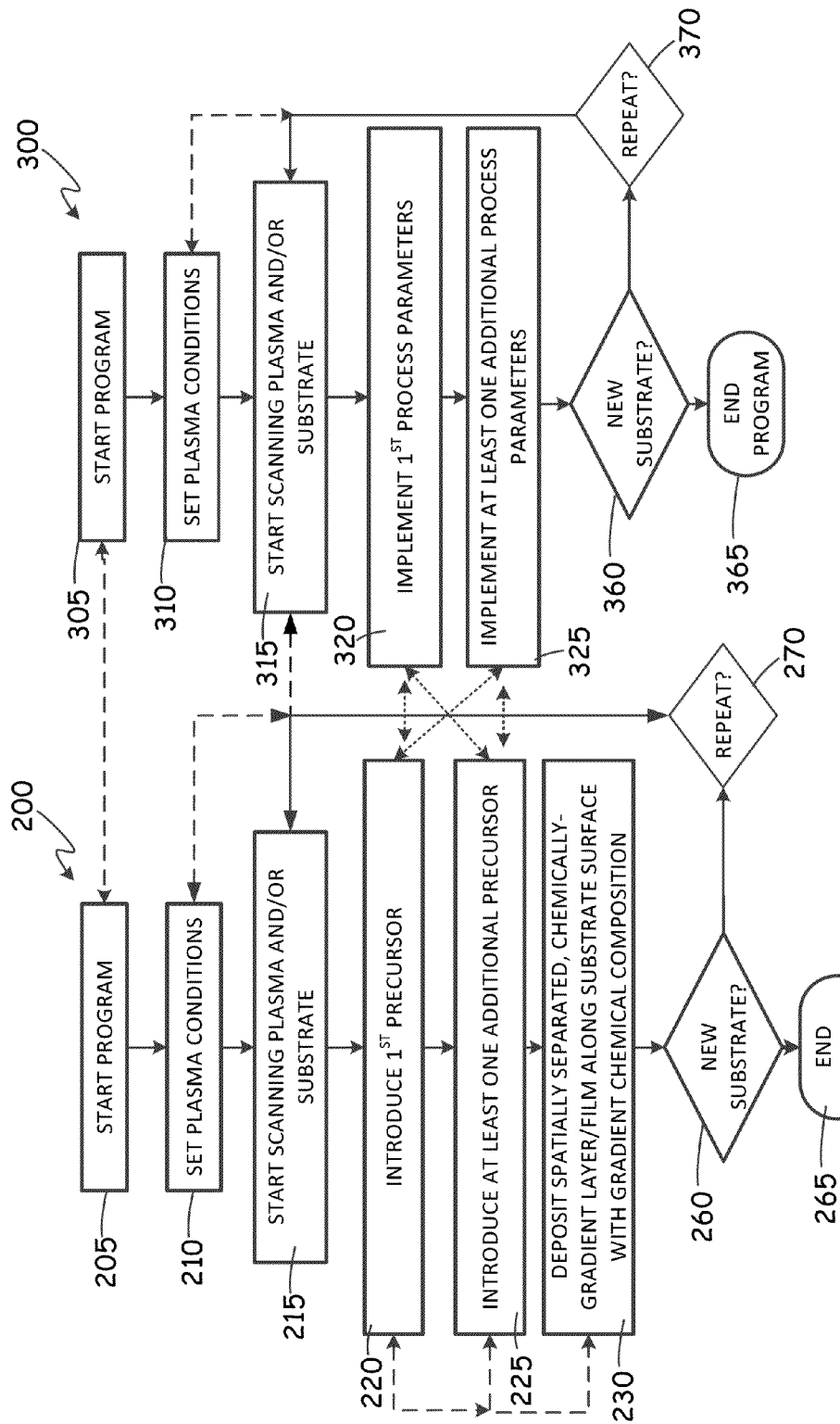
FIG. 2 depicts an exemplary flowchart of an aspect of present method disclosed herein.

With reference now to FIG. 2, process flowchart diagrams 200 and 300, respectively, are shown that can constitute separate, independent processing, or coupled processing programs. Thus, steps 205 and 305 provide for a starting program and the setting plasma conditions (step 210, 310). Steps 215 and 315, provide for starting scanning and/or rastering of the plasma head and/or or translation (in the vertical and/or horizontal direction relative to the substrate) of the substrate. Steps 220, 225, and 230 can be independent of and/or coupled to one or both of steps 320 and/or 325, which provide for the introduction of the first precursor the implementation of first process parameters, introduction of at least one additional precursor, implementation of at least one additional process parameter, and the deposition of spatially separated, layer along the substrate surface with a gradient chemical composition. Steps 260, 360, 265, 365, 270 and 370 provide for continuous operation of the method and/or termination, as shown.

Aspects of the present disclosure described herein with reference to flowchart illustrations and/or block diagrams of methods or apparatus (systems) above will be understood such that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus. The flowcharts and block diagrams in the Figures illustrate the functionality and operation of possible implementations of systems and methods according to various aspects of the present disclosure. In this regard, each block in the flowchart or block diagrams may represent a processor operation, any of which can be represented by one or more executable instructions for implementation by a computer. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved or the resultant film desired. It will also be noted that each block of the block diagrams and/or flowchart illustration, and combinations of blocks in the block diagrams and/or flowchart illustration, can be implemented by special purpose hardware-based, automated systems which perform the specified functions or acts.

Figure 3A:
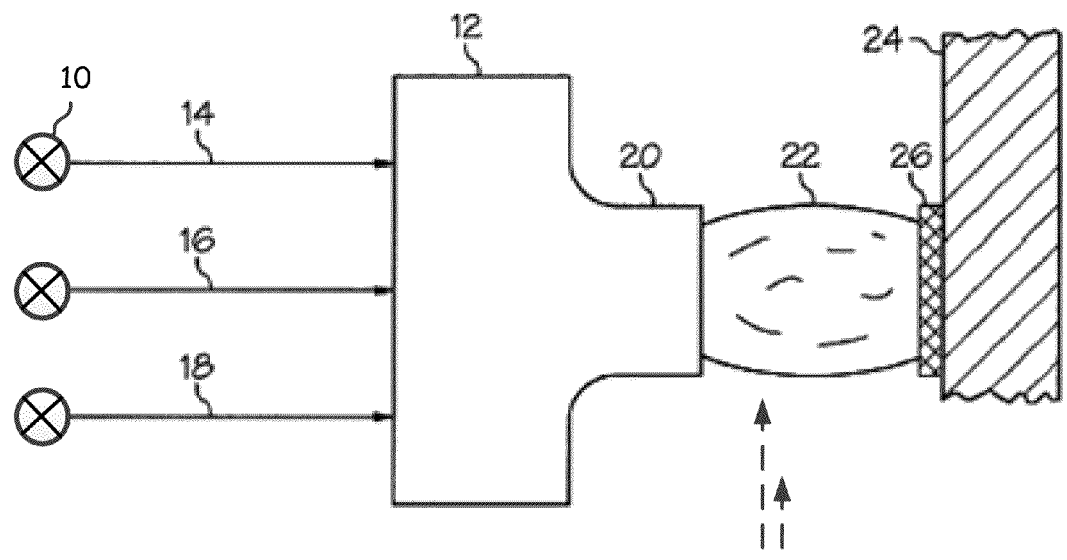
FIG. 3A depicts an exemplary aspect of the present method disclosed herein.
Figure 3B:
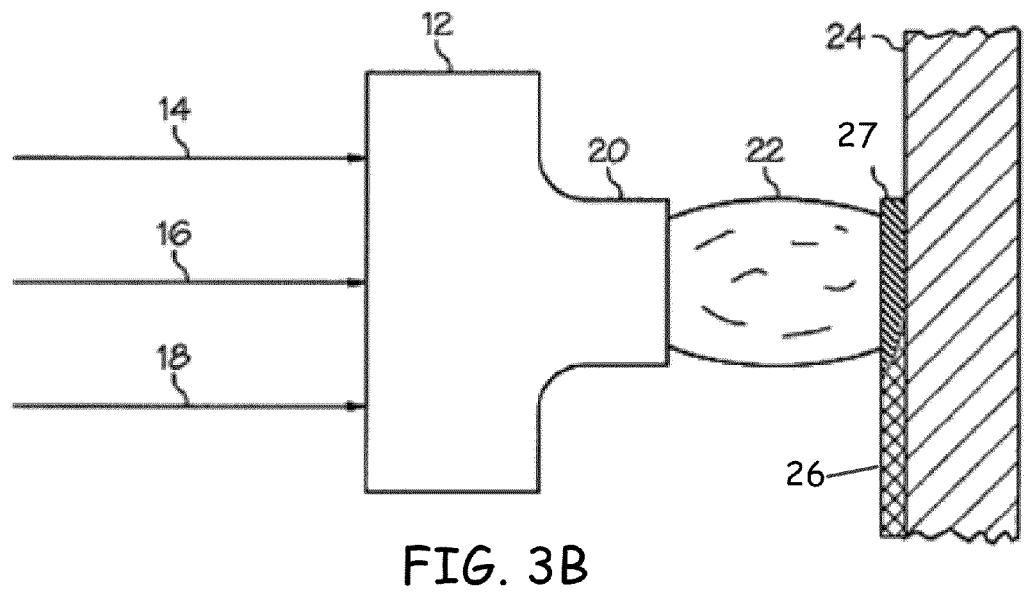
FIG. 3B depicts an exemplary aspect of the present method disclosed herein.

Referring now to FIG. 3A and FIG. 3B, one aspect of the disclosed system for applying multi-layer and/or gradient composition coatings is depicted, that includes an atmospheric plasma device 12, one or more plasma-source gas streams 14, one or more precursor streams 16 and, optionally, one or more shielding gas streams 18. The output 20 of the atmospheric plasma device 12 is a mono- or multicomponent plasma 22, which can be horizontally or vertically positioned relative to substrate 24 to apply a multi-layer coating 26 onto substrate 24. Plasma 22 can be of any shape, for example, as shown in FIG. 3A, or as a point source, shower-head like pattern, or a divergent or convergent shape.

The substrate 24 can be any substrate capable of receiving multi-layer coating by way of plasma 22. Substrate 24 can be metal or non-metal, where non-metal is inclusive of ceramics, plastics, polymers, composites of inorganic/organic materials, composites of polymers and inorganic/organic fibers. Substrate 24 can be conductive, nonconductive, or semi-conductive. In one particular aspect, the substrate 24 can be a transparent polymeric substrate, such as stretched acrylic. Furthermore, while FIG. 3 shows a substrate 24 having a substantially flat configuration, those skilled in the art will appreciate that substrates 24 having various shapes, surface contour, sizes and configurations can be used without departing from the scope of the present disclosure.

The atmospheric plasma device 12 can be any apparatus or system capable of exciting matter to form plasma 22, preferably under atmospheric conditions. The atmospheric plasma device 12 can be configured to generate the plasma 22 using direct current energy, radio frequency energy or the like, as is known in the art. In one aspect, the atmospheric plasma device 12 can be an atmospheric plasma spray gun. One example of an atmospheric plasma device 12 useful in accordance with the present disclosure is the ATOMFLO™ 400 plasma system available from Surfx Technologies, LLC of Culver City, Calif.

The plasma-source gas stream 14 can be a stream of one or more gaseous chemical precursors (reactive and/or nonreactive) capable of forming atmospheric plasma upon activation by the atmospheric plasma device 12. Examples of appropriate plasma-forming gases include molecular compounds naturally occurring as a gas, such as oxygen gas ($O_2$), nitrogen gas ($N_2$), hydrogen gas ($H_2$) and fluorine gas ($F_2$), as well as other gases such as the noble gases (helium, neon, argon, krypton). The plasma-source gas stream 14 can also include specific combinations of gases. By way of example, the plasma-source gas stream 14 can be a stream of substantially pure helium or argon gas that may allow the plasma to have a high concentration of active species while still maintaining a low temperature so as to deposit on temperature-sensitive polymers. The helium or argon gas may further contain one or more additional gases such as oxygen, nitrogen, carbon dioxide, hydrogen sulfide, ammonium, etc. The plasma-source gas stream 14 can be programmed for feeding the plasma device 12 for a time suitable to facilitate introduction of specific source gas streams combinations.

In one aspect, the plasma-source gas stream 14 can be supplied to the atmospheric plasma device 12 at non-ambient conditions. In another aspect, the plasma-source gas stream 14 can be supplied to the atmospheric plasma device 12 at ambient conditions. For example, the plasma-source gas stream 14 can be at a pressure of about 1 atm and a temperature of about 25° C. Those skilled in the art will appreciate that physical conditions of the plasma-source gas stream 14 can vary depend upon the specific application and can be adjusted to optimize the performance of the atmospheric plasma device 12 depending on the nature of the source materials, the substrate, and/or the final thickness and/or final composition of the multi-layer coating desired.

The precursor stream 16 can be one or more streams of the same or different precursor or precursors and, optionally, a carrier gas for introducing the precursor to the atmospheric plasma device 12. The carrier gas can be selected as a gas or combination of gases that does not undergo substantial plasma formation in the atmospheric plasma device 12. Examples of useful carrier gases include the noble gases, e.g., helium gas (He) and argon gas (Ar).

The precursor can be any material capable of forming film or coating 26 when deposited onto a substrate 24 by way of the atmospheric plasma 22. In one aspect, the precursor can be a material capable of forming a silicon oxy-carbide ($SiO_xC_y$) film or coating when deposited onto a substrate 24 by way of the atmospheric plasma 22. In another aspect, the precursor can be (or can include) a cyclic siloxane. Examples of precursors include tetra methylcyclocyclotetrasiloxane ("TMCTS"), octamethylcyclocyclotetrasiloxane ("OMCTS"), dimethyl siloxane ("DMSO") and hexamethyldisiloxane ("HMDSO"). Combinations of these precursors can be used sequentially and/or together in the methods disclosed herein. In one aspect, one or more monomers can be introduced alone or in combination with other chemical precursors into the atmospheric plasma to produce polymerized films. In yet another aspect, organometallic compounds, such as for example, diethyl zinc, tetra alkyl titanium compounds can be introduced alone or in combination with other chemical precursors into the atmospheric plasma to produce conductive, semi-conductive, or insulative films are coatings such as, 1,2-bis(triethoxysilyl)ethane (BTESE), tetra ethoxysilane (TEOS), hexamethyldisilazane (HMDSN) for providing wear resistant and/or abrasion resistant films; 3,4-ethylenedioxythiophene (EDOT), pyrrole-containing precursors to provide conductive polymer films; $CHClF_2$ (Chlorodifluoromethane) for providing hydrophobic films; indium $(acac)_3$ for providing indium tin oxide, mixed different zinc nitrate with indium nitrate for providing Zn-doped indium oxide for providing semiconductive transparent films, etc.

In one aspect, the precursor can be a relatively high vapor pressure liquid at standard temperature and pressure, and the carrier gas can be bubbled through the precursor to form the precursor stream 16. However, those skilled in the art will appreciate that various alternative techniques, such as vaporization, can be used to introduce one or more precursors to the precursor stream 16. In one specific aspect, the precursor stream 16 can be formed by bubbling helium gas through TMCTS liquid at ambient conditions.

The shielding gas stream 18 can be a stream of shielding gas that does not undergo substantial plasma formation in the atmospheric plasma device 12. The shielding gas can be present in the plasma 22, but, without being limited to any particular theory, may minimize the effects of atmospheric water, oxygen and other contaminants on the plasma 22.

Examples of appropriate shielding gases include the noble gases, e.g., helium gas (He) and argon gas (Ar). The shielding gas stream 18 may include combinations of shielding gases. In one particular aspect, the shielding gas stream 18 can be a stream of substantially pure helium gas.

In one aspect, the shielding gas stream 18 can be supplied to the atmospheric plasma device 12 at non-ambient conditions. In another aspect, the shielding gas stream 14 can be supplied to the atmospheric plasma device 12 at ambient conditions. For example, the shielding gas stream 14 can be at a pressure of about 1 atm and a temperature of about 25° C. Those skilled in the art will appreciate that physical conditions of the shielding gas stream 14 may depend upon the specific application and can be adjusted to optimize the performance of the atmospheric plasma device 12.

At this point, those skilled in the art will appreciate that the plasma-source gas stream 14, the precursor stream 16 and the shielding gas stream 18 can be configured for introduction to the atmospheric plasma device 12 to form the plasma 22. However, those skilled in the art will also appreciate that two or more of the plasma-source gas, precursor and shielding gas streams 14, 16, 18 can be combined and/or mixed prior to reaching the atmospheric plasma device 12. For example, the plasma-source gas, precursor, and shielding gas streams 14, 16, 18 can be supplied to the atmospheric plasma device 12 as a single stream.

The flow rates of the plasma-source gas, precursor and shielding gas streams 14, 16, 18 can be controlled to obtain desired concentrations of the plasma-source gas, precursor and shielding gas in the plasma 22. Shown in FIG. 3A, control valves 10 can be provided on the plasma-source gas, precursor and shielding gas streams 14, 16, 18 to control the associated flow rates. Those skilled in the art will appreciate that the relative concentrations of the plasma-source gas, precursor and shielding gas in the plasma 22 can be manipulated to optimize performance of the atmospheric plasma device 12 and to impart the resulting coating 26 with desired properties. For example, the concentration of oxygen in the plasma 22 can be decreased (e.g., by adjusting flow rate) to increase the carbon content of the coating 26, thereby yielding a base film or layer 26. Alternatively, the concentration of oxygen in the plasma 22 can be increased to render the layer more inorganic, thereby yielding a denser, e.g., harder layer (e.g., greater modulus than the underlying layer or film) as discussed below. Likewise, the concentration of oxygen in the plasma 22 can be decreased to render the layer more organic with a lower modulus and more elasticity.

In one aspect, the plasma-source gas stream 14 may comprise about 30 LPM of the input to the atmospheric plasma device 12 and the precursor stream 16 may comprise about 2-5 LPM of the input to the atmospheric plasma device 12, with the shielding gas stream 18 comprising the balance. In another aspect, the plasma-source gas stream 14 may comprise at most about 2 percent by volume of the input to the atmospheric plasma device 12 and the precursor stream 16 may comprise at most about 5 percent by volume of the input to the atmospheric plasma device 12, with the shielding gas stream 18 comprising the balance. In yet another aspect, the plasma-source gas stream 14 may comprise about 1 to 2 percent by volume of the input to the atmospheric plasma device 12 and the precursor stream 16 may comprise about 0 to about 10 percent by volume of the input to the atmospheric plasma device 12, with the shielding gas stream 18 comprising 0-100 percent by volume.

Figure 4A:
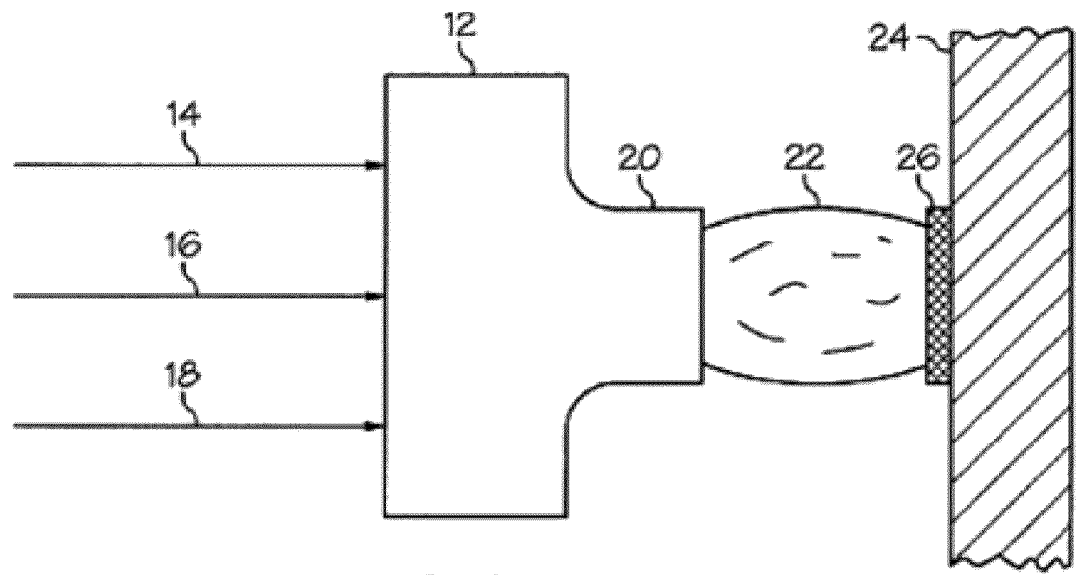
FIG. 4A depicts an exemplary aspect of the present method disclosed herein.
Figure 4B:
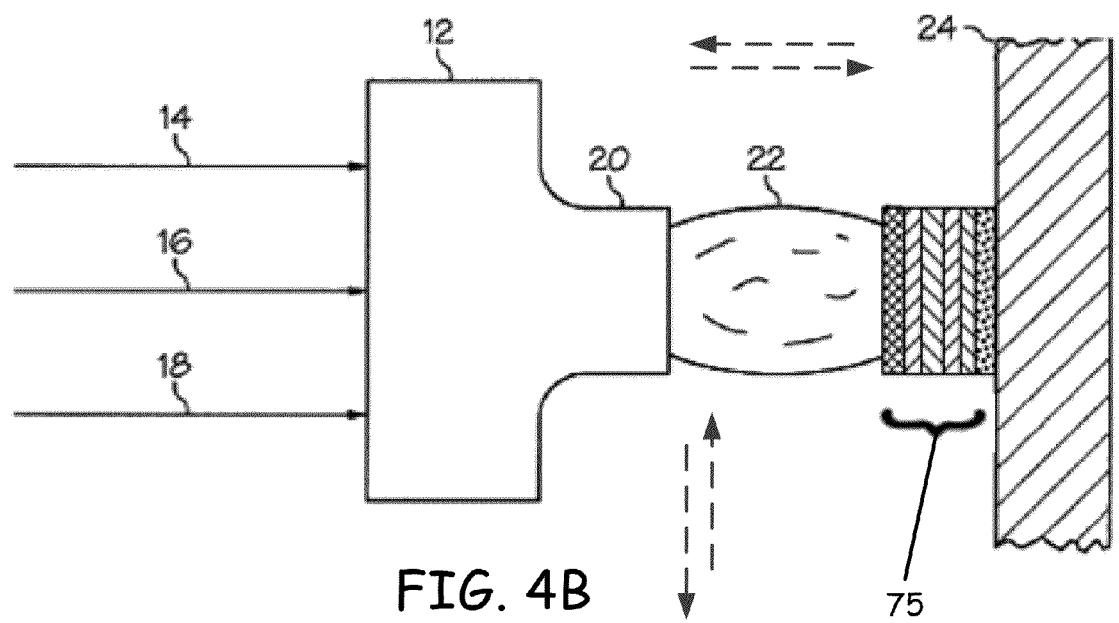
FIG. 4B depicts an exemplary aspect of the present method disclosed herein.
Figure 5:
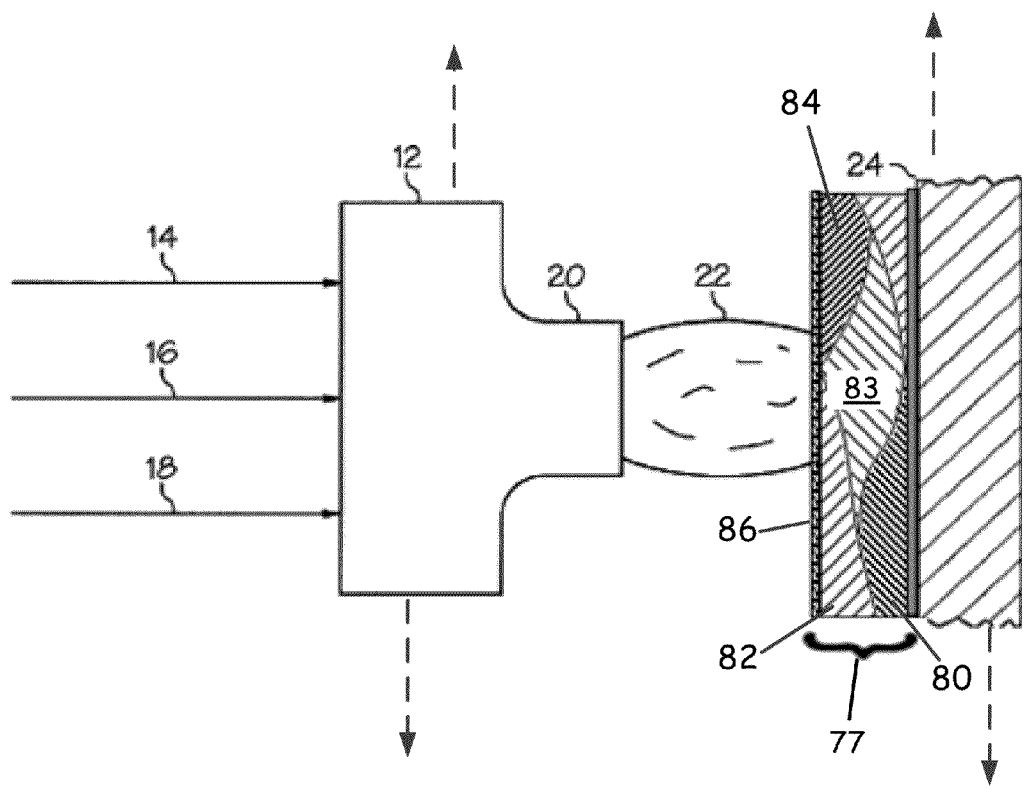
FIG. 5 depicts an exemplary aspect of the present method disclosed herein.

Referring again to FIGS. 3A, 3B, as well as FIGS. 4A, 4B, 5, a method for applying a multi-layer film coating 26 to a substrate 24, can begin with the step of cleaning the substrate, not shown. The substrate 24 can be cleaned using various solvents, such as ketones or light alcohols (e.g., methanol or isopropyl alcohol). A plasma may also be used to clean and/or activate the substrate 24. The presence of oxygen in the plasma may activate the surface receiving the multi-layer film coating 26. The clean substrate may optionally be treated with an adhesion promoter, such as an aluminum-based sol-gel adhesion promoter or silicon-based adhesion promoter, as is known in the art.

The presently disclosed system can be configured by supplying the atmospheric plasma device 12 with the plasma-source gas, precursor and shielding gas streams 14, 16, 18 to form the plasma 22. The size (width or diameter) of the plasma 22 may depend on various factors, including the size of the atmospheric plasma device 12 and the flow rates of the plasma-source gas, precursor and shielding gas streams 14, 16, 18. For example, the plasma 22 can be about 2 inches wide.

With specific reference to FIGS. 3A and 3B, the substrate 24 can be spatially coated by horizontally positioning the substrate 24 relative to the atmospheric plasma device 12 such that the plasma 22 deposits a first coating 26 onto the substrate. Plasma 22 can be translated along a direction essentially parallel to the surface of the substrate and/or raster scanned across the substrate 24 to deposit a second coating 27 on (or directly on) the surface of the substrate 24, the second coating being, for example, of different chemical composition or of a gradient composition than that of the first coating as shown by the dashed double arrows. The relationship between the first and the second coating can be random or can be a pattern presented in 2 dimensions e.g., the longitudinal axis of the deposited multi-layer film.

While a hand-held device can be used, those skilled in the art will appreciate that appropriate automation can be employed such that a multi-axis controlled unit is provided and/or maintained between and/or along the substrate 24 and the atmospheric plasma device 12. One or more additional coatings having continuous, semi-continuous, or stepped-like gradient chemical compositions can be deposited spatially over one or both of coatings 26, 27. Other coatings (non-plasma deposited) can be applied to the spatially separated coatings 26, 27 using any other appropriate coating methods (e.g., sol-gel).

With reference to FIGS. 4A and 4B, an example multi-layer coating 75 is depicted, where the plasma device 12 is translated horizontally and/or vertically relative to the substrate surface as indicated by the pair of dashed double arrows. Combinations of the spatially separated aspects of FIGS. 3A and 3B and aspects of FIGS. 4A and 4B are envisioned.

With reference to FIG. 5, an aspect of a multi-layer coating 77 is depicted. Multi-layer coating 77 is shown with the plurality of deposited films 80, 82, 83, 84, and 86 which can be deposited by adjustment of one or more process parameters including precursor source composition, precursor source composition and plasma-source gas composition, translation speed of substrate 24 alone or in combination with vertical adjustment of plasma device 12 as well as other process parameters or combination of the process parameters previously mentioned, for example as shown by dashed arrows representing translation of either plasma head 12 or substrate 24. Deposited films 80, 82, 83, 84 and 86 are representative of one or more of spatially separated deposited films and deposited films having chemical composition gradients in the vertical or horizontal direction relative to the substrate they are deposited upon. In one aspect, the methods disclosed herein are used to provide a gradient multilayer film on the surface of an article. The surface of the article can be at least a portion of an aerospace vehicle. As shown in FIG. 5, a first film can be provided within a second film or a plurality of films, one or more of the films (being the same or different chemical composition) having, independently, varying elemental compositions (one or more elements of the film's composition) in a multi-dimensional pattern, for example, by control of one or more of process parameters and/or plasma head translation and/or translation of the article (or substrate).

EXAMPLES

An atmospheric plasma Atomflo 400 device obtained from Surfx Technologies LLC was used to deposit multi-layered films. Table 1 represents processing conditions for the preparation of spatially separated silicon oxy-carbide (SiOxCy) coatings on an aluminum substrate. The device was supplied with approximately 0.3-0.5 L/min oxygen gas, 1.0 L/min of TMCTS and/or HMDSO carried by helium gas, and 30 L/min helium gas (shielding gas). The TMCTS/helium stream was obtained by bubbling the helium gas carrier through a container of TMCTS liquid at ambient conditions. From the foregoing description, various modifications and changes in the compositions and method will occur to those skilled in the art.

TABLE 1

Deposition conditions for samples G-1 and G-2 (aluminum substrates) prepared for Auger analysis and deposition conditions for samples G-3, G-4, and ML-17 prepared on bare acrylic substrates.

| position | Precursor L/min | Power (W) | O2 L/min | Bubbler (LPM) | Dilution (LPM) | Speed (mm/sec) | Distance (mm) | Precursor T ° C. | # passes |
|---|---|---|---|---|---|---|---|---|---|
| G-1 | TMCTS | 120 | 0.35 | 1.2 | 1.2 | 25 | 5 | 20 | 6 |
| | TMCTS | 120 | 0.32 | 1.2 | 1.2 | 25 | 5 | 20 | 1 |
| | TMCTS | 120 | 0.29 | 1 | 1.2 | 25 | 5 | 20 | 2 |
| | TMCTS | 120 | 0.27 | 0.9 | 1.2 | 25 | 5 | 20 | 1 |
| | TMCTS | 120 | 0.25 | 0.8 | 1.2 | 25 | 5 | 20 | 2 |
| | TMCTS | 120 | 0.25 | 0.7 | 1.2 | 25 | 5 | 20 | 1 |
| | HMDSO | | | 0.05 | 1.3 | 25 | 5 | 7 | |
| | TMCTS | 120 | 0.25 | 0.65 | 1.2 | 25 | 5 | 20 | 2 |
| | HMDSO | | | 0.07 | 1.3 | 25 | 5 | 7 | |
| | TMCTS | 120 | 0.3 | 0.6 | 1.2 | 25 | 5 | 20 | 1 |
| | HMDSO | | | 0.09 | 1.3 | 25 | 5 | 7 | |
| | TMCTS | 120 | 0.3 | 0.55 | 1.2 | 25 | 5 | 20 | 2 |
| | HMDSO | | | 0.11 | 1.3 | 25 | 5 | 7 | |
| | TMCTS | 120 | 0.3 | 0.5 | 1.2 | 25 | 5 | 20 | 1 |
| | HMDSO | | | 0.13 | 1.3 | 25 | 5 | 7 | |
| | TMCTS | 120 | 0.3 | 0.45 | 1.2 | 25 | 5 | 20 | 2 |
| | HMDSO | | | 0.15 | 1.3 | 25 | 5 | 7 | |
| | TMCTS | 120 | 0.3 | 0.4 | 1.2 | 25 | 5 | 20 | 1 |
| | HMDSO | | | 0.17 | 1.3 | 25 | 5 | 7 | |
| | TMCTS | 120 | 0.35 | 0.3 | 1.2 | 25 | 5 | 20 | 2 |
| | HMDSO | | | 0.2 | 1.3 | 25 | 5 | 7 | |
| | TMCTS | 120 | 0.4 | 0.2 | 1.2 | 25 | 5 | 20 | 1 |
| | HMDSO | | | 0.24 | 1.3 | 25 | 5 | 7 | |
| | TMCTS | 120 | 0.45 | 0.1 | 1.2 | 25 | 5 | 20 | 2 |
| | HMDSO | | | 0.27 | 1.3 | 25 | 5 | 7 | |
| | HMDSO | 120 | 0.5 | 0.3 | 2.5 | 25 | 5 | 7 | 3 |
| G-2 | TMCTS | 120 | 0.35 | 1.2 | 1.2 | 40 | 5 | 10 | 12 |
| | TMCTS | 120 | 0.4 | 0.8 | 1.2 | 40 | 5 | 10 | 5 |
| | HMDSO | | | 0.15 | 1.3 | 40 | 5 | 7 | |
| | TMCTS | 120 | 0.45 | 0.4 | 1.2 | 40 | 5 | 10 | 5 |
| | HMDSO | | | 0.3 | 1.3 | 40 | 5 | 7 | |
| | HMDSO | 120 | 0.5 | 0.4 | 3.5 | 40 | 5 | 7 | 8 |
| G-3 | TMCTS | 120 | 0.35 | 1.2 | 1.2 | 40 | 5 | 10 | 24 |
| | TMCTS | 120 | 0.35 | 1.2 | 1.2 | 40 | 5 | 10 | 1 |
| | HMDSO | | | 0.15 | 2 | 40 | 5 | 14 | |
| | TMCTS | 120 | 0.35 | 0.8 | 1.2 | 40 | 5 | 10 | 3 |
| | HMDSO | | | 0.15 | 2 | 40 | 5 | 11 | |
| | TMCTS | 120 | 0.3 | 0.4 | 1.2 | 40 | 5 | 10 | 4 |
| | HMDSO | | | 0.3 | 2 | 40 | 5 | 7 | |
| | TMCTS | 120 | 0.3 | 0.2 | 1.2 | 40 | 5 | 10 | 4 |
| | HMDSO | | | 0.4 | 2 | 40 | 5 | 7 | |
| | HMDSO | 120 | 0.3 | 0.4 | 3.5 | 40 | 5 | 7 | 7 |
| G-4 | TMCTS | 120 | 0.32 | 1.2 | 1.2 | 40 | 5 | 10 | 8 |
| | TMCTS | 120 | 0.32 | 0.6 | 1.2 | 40 | 5 | 10 | |
| | HMDSO | | | 0.4 | 1.3 | 40 | 5 | 7 | 4 |
| | TMCTS | 120 | 0.32 | 1.2 | 1.2 | 40 | 5 | 10 | 4 |
| | TMCTS | 120 | 0.32 | 0.6 | 1.2 | 40 | 5 | 10 | |
| | HMDSO | | | 0.4 | 1.3 | 40 | 5 | 7 | 4 |
| | TMCTS | 120 | 0.32 | 1.2 | 1.2 | 40 | 5 | 10 | 4 |
| | TMCTS | 120 | 0.32 | 0.6 | 1.2 | 40 | 5 | 10 | |
| | HMDSO | | | 0.4 | 1.3 | 40 | 5 | 7 | 4 |
| | TMCTS | 120 | 0.32 | 1.2 | 1.2 | 40 | 5 | 10 | 4 |
| | TMCTS | 120 | 0.32 | 0.6 | 1.2 | 40 | 5 | 10 | |
| | HMDSO | | | 0.4 | 1.3 | 40 | 5 | 7 | 4 |

TABLE 1-continued

Deposition conditions for samples G-1 and G-2 (aluminum substrates) prepared for Auger analysis and deposition conditions for samples G-3, G-4, and ML-17 prepared on bare acrylic substrates.

| position | Precursor | Power (W) | O2 L/min | Bubbler (LPM) | Dilution (LPM) | Speed (mm/sec) | Distance (mm) | Precursor T °C. | # passes |
|---|---|---|---|---|---|---|---|---|---|
| ML_17 | TMCTS | 120 | 0.45 | 1.2 | 1.2 | 40 | 5 | 10 | 12 |
|  | TMCTS | 120 | 0.42 | 1.2 | 1.2 | 40 | 5 | 10 | 8 |
|  | TMCTS | 120 | 0.39 | 1.2 | 1.2 | 40 | 5 | 10 | 4 |
|  | TMCTS | 120 | 0.36 | 1.2 | 1.2 | 40 | 5 | 10 | 4 |
|  | TMCTS | 120 | 0.33 | 1.2 | 1.2 | 40 | 5 | 10 | 2 |
|  | TMCTS | 120 | 0.3 | 1.2 | 1.2 | 40 | 5 | 10 | 1 |
|  | TMCTS | 120 | 0.27 | 1.2 | 1.2 | 40 | 5 | 10 | 1 |
|  | TMCTS | 120 | 0.23 | 1.2 | 1.2 | 40 | 5 | 10 | 1 |
|  | TMCTS | 120 | 0.2 | 1.2 | 1.2 | 40 | 5 | 10 | 4 |

Table 1 demonstrates modification of one or more of plasma power, carrier gas flow rate, precursor temperature, bubbler flow rate, or dilution flow rate, which will affect the composition of the one or more layers during deposition as shown in Table 2. Plasma head vertical position was held constant in these examples, relative to the substrate surface, but the vertical position of the plasma head can be varied as discussed above.

Table 2 represents Auger Analysis performed on sample "G1" above in a first spatially separated area designated #3. 1,000 Å thick $Ta_2O_5$ thickness standards were used to calibrate the argon ion sputtering rate. The calculated sputtering rate was 125 Å/min. Change in carbon content measured by Auger electron spectroscopy and/or Scanning Electron Microscopy (SEM) and Energy Dispersive X-Ray (EDX) analysis (SEM-EDX) analysis methods indicated more carbon content near the bottom, demonstrating the gradation in the composition in at least one dimension. The top of the film has virtually no or trace amounts of carbon, creating a glassy, durable, harder film on top. A high concentration of carbon at the bottom of the film provides for improved adhesion to a polymeric substrate.

TABLE 2

Auger analysis of samples G1 in a first spatially separated area #3.

| Depth (angstroms) | C (atomic %) | Si (atomic %) | O (atomic %) |
|---|---|---|---|
| −1,000 | Non-detected | 44.5 | 55.5 |
| −1,500 | Non-detected | 42.6 | 57.4 |
| −2,000 | 9.1 | 39.8 | 51.1 |
| −2,500 | 10.8 | 39.2 | 50.0 |
| −3,000 | 8.1 | 39.7 | 52.1 |
| −3,500 | 11.4 | 40.1 | 48.4 |
| −4,000 | 7.0 | 41.0 | 52.0 |
| −4,500 | 10.8 | 38.7 | 50.5 |
| −5,000 | 15.7 | 36.4 | 47.9 |
| −5,500 | 13.0 | 38.0 | 49.0 |
| −6,000 | 14.8 | 39.8 | 45.5 |
| −6,500 (went through coating into aluminum) | — | — | — |

Table 3 represents Auger Analysis performed on sample "G2," corresponding to a second sample that was deposited with a combination of TMCTS and HMDSO precursors.

TABLE 3

Auger analysis of samples G2.

| Depth (angstroms) | C (atomic %) | Si (atomic %) | O (atomic %) |
|---|---|---|---|
| as-received | 9.9 | 33.0 | 57.0 |
| −100 | Non-detected | 42.1 | 57.9 |
| −200 | Non-detected | 39.4 | 60.6 |
| −300 | Non-detected | 40.5 | 59.5 |
| −400 | Non-detected | 41.6 | 58.4 |
| −500 | 12.3 | 36.6 | 51.1 |
| −600 | 12.3 | 38.0 | 49.6 |
| −700 | 6.6 | 39.1 | 54.3 |
| −800 | 12.1 | 37.9 | 50.0 |
| −900 | 11.0 | 39.4 | 49.6 |
| −1,000 | 12.7 | 38.5 | 48.8 |
| −1,500 | 8.9 | 40.0 | 51.1 |
| −2,000 | 10.9 | 39.6 | 49.5 |
| −2,500 | 12.8 | 38.1 | 49.1 |
| −3,000 | 13.2 | 39.7 | 47.1 |
| −3,500 | 16.1 | 36.7 | 47.1 |
| −4,000 | 17.2 | 36.3 | 46.4 |
| −4,500 | 18.4 | 34.7 | 46.8 |
| −5,000 | 21.4 | 37.0 | 41.7 |
| −5,500 | 22.6* | 16.5* | 40.2* |
| −6,000 (went through coating into aluminum) | — | — | — |

(*balance = Al)

Figure 6:
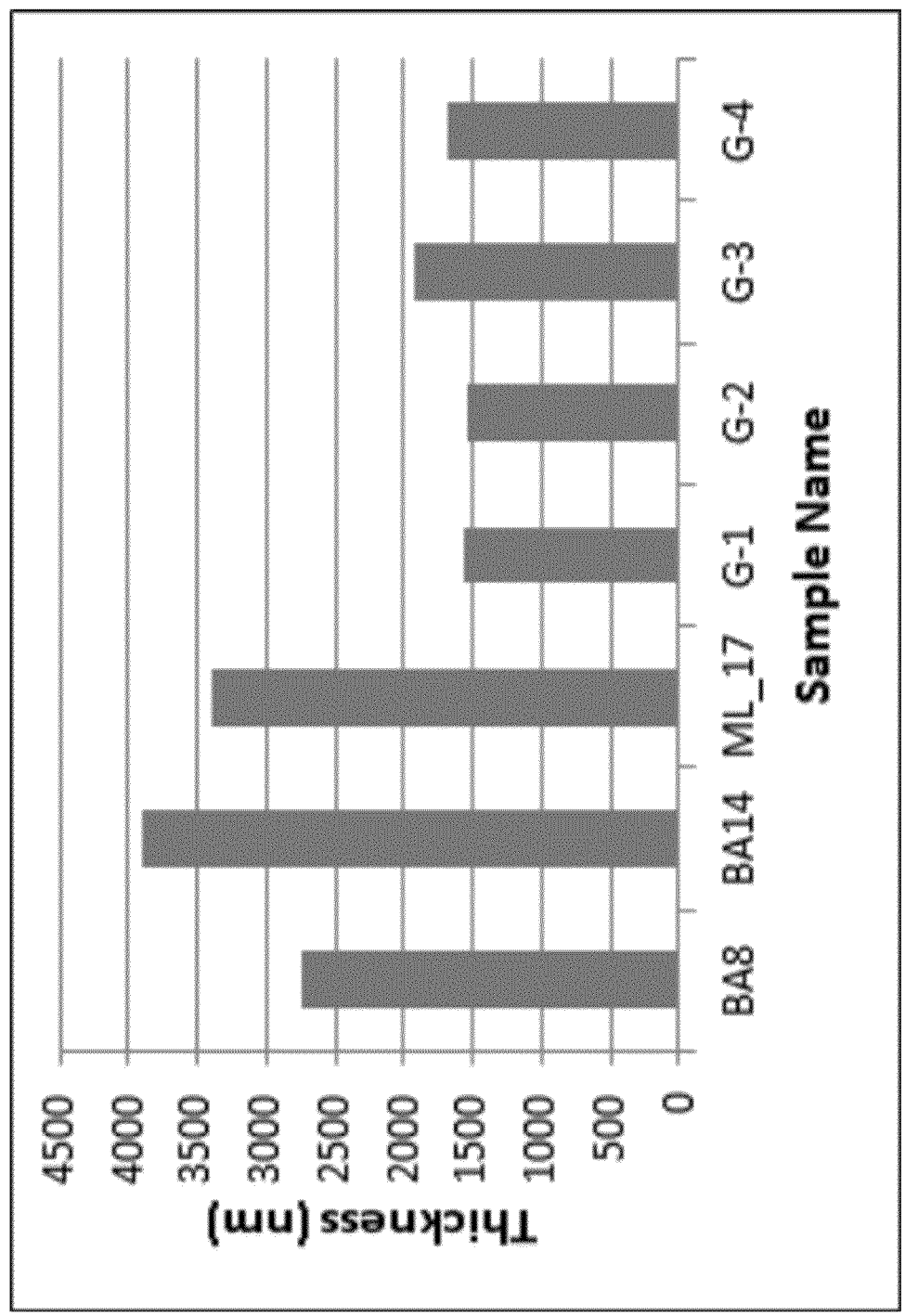
FIG. 6 depicts a graphical representation of thickness (nanometers) of deposited film samples of an aspect of the present method.
Figure 7:
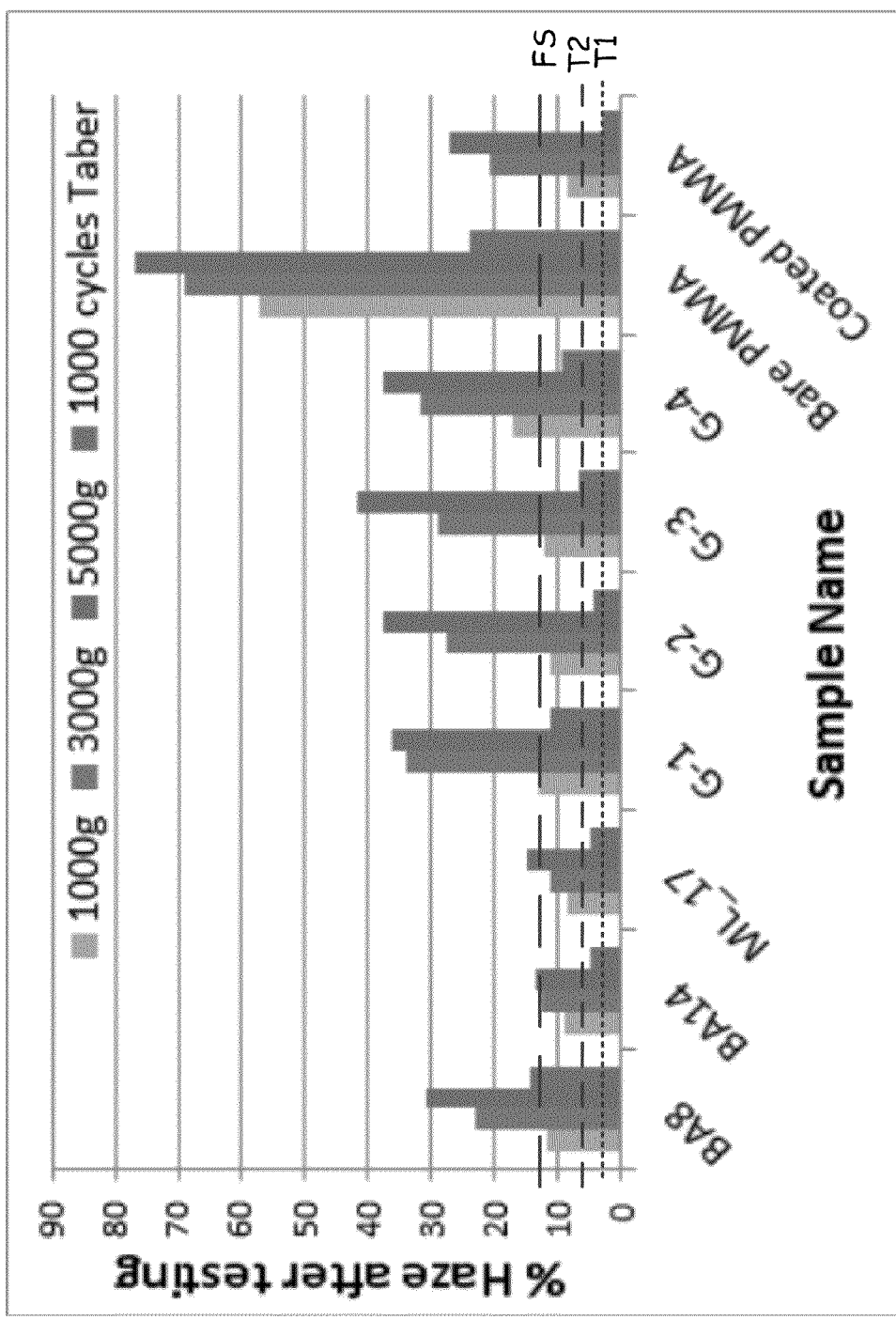
FIG. 7 depicts a graphical representation of percent haze after testing of deposited film samples of an aspect of the present method.

In another example, a gradient film deposition is provided wherein a thick base layer of a carbon-rich TMCTS film was deposited on top of a bare acrylic substrate. HMDSO, a precursor that creates a harder, glassier, coating, was gradually introduced in order to grade (create a gradient) the chemical composition of the film over the film thickness. While not being held to any particular theory it is believed that the use of TMCTS near the polymer surface (initial plasma deposition process stage) creates a good adhesive layer, while use of HMDSO at the end of the plasma deposition process provides a durable, glassy "top surface" finish. Samples G-1, G-2, G-3, and G-4 are created in a similar fashion. BA8 and BA14 are single layer TMCTS films, and ML__17 is a multi-layer film of TMCTS that is made by varying only the plasma $O_2$ flow rate as a function of time. Samples G-1, G-2, G-3, and G-4 are much thinner than BA8, BA14, and ML__17, as seen in FIG. 6. As such, they would not be predicted to possess as much erosion resistance as the thicker single layer films. Surprisingly, however, as shown in FIG. 7, several of these presently prepared gradient films actually perform better under Taber abrasion than single layer TMCTS films, which is believed due to the harder, SiO$_2$-like layer on top that is created with the HMDSO precursor in the final stages of the plasma deposition. Change in haze after falling sand testing for the single and multi-layer films presented in FIG. 7 shows similar unexpected results for the multi-layer films in comparison with the thicker single layer films While the nature of the substrate can be polymer or non-polymer, in one exemplary aspect, a stack of films were deposited on a bare poly methyl methacrylate (PMMA) substrate to provide a 2-4 micron thick layer film made from the plasma deposition of TMCTS precursor. TMCTS-plasma-films have been determined to have relatively low elastic modulus (around 10 GPa) that adheres well onto PMMA. As a result, TMCTS-plasma-film performs well under wet and dry adhesion testing, but may not be as durable as plasma-deposited films with a higher modulus. Therefore, the present method employs, by way of example, the deposition on (or directly on) of a second film made from plasma-deposited OMCTS precursor and/or another precursor with deposited film a modulus of greater than 10 GPa, e.g., about 15-20 GPa as measured by nanoindentation techniques (Nanoindenter XP; Agilent Technologies). In one aspect, the second film can be less than 1 micron thick. In yet another aspect, to provide for one or more specific functional properties, a top layer of a hard film, e.g., with a modulus of greater than 20 GPa, with a thickness around 500 nm, can be deposited on (or directly on) the second layer. Suitable functionalities obtainable by the presently disclosed method includes, without limitation, erosion and/or abrasion resistance, conductivity (electrical and/or thermal), optical properties (haze or clarity), radiation absorption and/or reflection (IR, microwave, etc.) or combinations ("multifunctionality").

FIG. 8 provides process parameters and physical properties of additional samples of gradient multi-layer films prepared from OMCTS precursor gas streams with varying process parameters to provide a chemical gradient throughout the horizontal thickness of the film relative to the substrate surface, TMCTS precursor gas streams with varying process parameters, and combinations of same. As summarized in FIG. 8, by gradually changing the chemical composition, and hence, the mechanical and/or physical properties throughout the multi-layer stack, optimization of substrate-enhanced properties, e.g., clarity, haze, and Taber abrasion can be provided. For example, the resistance to both erosion and abrasion while optimizing adhesion throughout the entire film can be provided with the selection of TMCTS-OMCTS deposited in a sequential manner. In addition to durable coatings, multi-layer stacks made for example with atmospheric plasma deposition can be used to incorporate other multifunctionality into the surface. For instance, semiconductive zinc oxide (ZnO) films can be deposited using atmospheric plasma deposition (ZnO-plasma-films) to provide a durable silicon-oxy-carbide coating. Likewise, ZnO or other conductive films can be deposited on substrates such as polycarbonate or carbon fiber reinforced polymers (CFRP) for improving static dissipation of charge buildup.

In one aspect, multi-layer films having conductive (electrical) properties can be combined with a dielectric, protective plasma deposited film. Thus, a conductive ZnO-plasma-film can be deposited in accordance with the present disclosure and this deposited film can be protected, for example, using the durable film stack of TMCTS-OMCTS as described above, e.g., by depositing on or directly on the top. Other possible multifunctional films include infrared rejecting/deflecting films to reduce heat load encompassed by a durable layer or energy harvesting films incorporated with a durable film stack as described above.

In one aspect of the present disclosure, commercial robotics can be configured to control whole deposition or material layout systems. In one aspect, the plasma head 12 can be adapted to an articulated arm of a robotic system that is coupled to one or more controllers and/or centralized control system to provide at least two-axes translation of the plasma head for the deposition of the multi-layer or gradient films. Likewise, the substrate or article can be configured to be translated in multi-axial directions during deposition. Both the plasma head and article/substrate can be configured for multi-axial translation. In another aspect, the gradient film deposition process is presently disclosed can be totally automated so as to provide gradient films that vary spatially in their mechanical properties, for example, by slightly changing the deposition conditions as the plasma head scans over the substrate surface. One or more parameters that have been found to affect mechanical properties of the presently disclosed multi-gradient films include oxygen flow rate, helium flow rate through the chemical, plasma head speed, and plasma power. These parameters can be programmed to vary as the plasma head scans across a surface in order to deposit spatially gradient films for can be manually controlled during a deposition process. By way of example, an example where this type of process can be used is as follows: if a certain part of a substrate will be covered with a sealant, the appropriate mechanical properties of the spatially gradient film will be different depending on the composition of the substrate. Using this automated atmospheric plasma deposition method, one can "grade" the composition and properties of plasma-deposited films spatially, thereby creating an optimal film for parts that vary over their surface without the need for masking or other time-consuming and difficult techniques. In other aspects, the methods disclosed herein can be employed for repairing a component.

The aspects and aspects disclosed herein presented for purposes of illustration and description, but are not intended to be exhaustive or limited to such aspects or aspects in the form disclosed. Many modifications and variations will be apparent to those of ordinary skill in the art without departing from the scope and spirit of aspects of the appended claims. The aspects were chosen and described in order to best explain the principles of aspects of the present disclosure and the practical application, and to enable others of ordinary skill in the art to understand the various aspects with various modifications as are suited to the particular use contemplated.

Although specific aspects have been illustrated and described herein, those of ordinary skill in the art appreciate that any arrangement which is calculated to achieve the same purpose may be substituted for the specific aspects shown and that aspects of the invention have other applications in other environments.

We claim:

1. A method for making multi-layer gradient composition thin films, the method comprising:
   introducing at least one chemical precursor into a plasma wherein the introducing comprises a first chemical precursor and at least one other chemical precursor different from the first chemical precursor;
   depositing a thickness of a first film to a surface of a substrate, the first film having a chemical composition derived from the at least one chemical precursor;
   modifying at least one plasma-related process parameter related to the deposition of the at least one chemical precursor during the depositing of a thickness of a first film;
   varying the chemical composition of at least a portion of the thickness of the first film, independently or in combination, in a vertical direction or in a vertical and horizontal direction relative to the substrate depositing, within the first film, a thickness of a second film derived at least in part from a second chemical precursor, the second film of a chemical composition different from the first film, at least a portion of the second film being spatially separated from the first film in a horizontal, a vertical, or a horizontal and vertical direction relative to the article surface; and providing an interface between the first film and the second film, the interface comprising a change in elemental composition of the first film relative to that of the second film, wherein the interface is between a vertical section of the first film and a vertical section the second film, relative to the article surface.

2. The method of claim 1, wherein the introducing comprises a first chemical precursor and the at least one other chemical precursor different from the first chemical precursor concurrently with the first chemical precursor into the plasma.

3. The method of claim 1, wherein the introducing comprises a first chemical precursor and the at least one other chemical precursor different from the first chemical precursor subsequently into the plasma.

4. The method of claim 1, wherein the modifying comprises varying one or more parameters selected from the group consisting of plasma power, carrier gas flow rate, precursor temperature, bubbler flow rate, dilution flow rate, or plasma head vertical position relative to the substrate.

5. The method of claim 1, wherein the substrate comprises one or more semiconductive materials, metals, or non-metals.

6. The method of claim 1, wherein the deposition comprises an atmospheric plasma deposition technique.

7. An article comprising a thickness of a first film comprising silicon-oxy-carbide from a surface of the article; the first film having a gradient chemical composition within at least a portion of the thickness of the first film in a vertical direction, or in a horizontal and vertical direction relative to the surface of the article a second film different from the first film, the second film present within the first film, the second film of a gradient chemical composition, and at least a portion of the second film being spatially separated from the first film in a horizontal, a vertical, or a horizontal and vertical direction relative to the article surface;

an interface between the first film and the second film, the interface comprising a change in elemental composition of the first film relative to that of the second film; wherein the interface is between a vertical section of the first film and a vertical section the second film, relative to the article surface.

8. The article of claim 7, wherein the second film is chemically different from the first film in a vertical direction relative to the article surface.

9. The article of claim 7, wherein the second film is present directly on the first film.

10. The article of claim 7, wherein the interface between the first film and the second film comprises an elemental composition gradient of one or both of oxygen and carbon.

11. The article of claim 7, wherein the surface of the article is at least a portion of an aerospace vehicle.

12. An article comprising a thickness of a first film from a surface of the article; the first film having a gradient chemical composition within at least a portion of the thickness of the first film in a vertical direction, or in a horizontal and vertical direction relative to the surface of the article;

an interface between the first film and a second film, the interface comprising a change in elemental composition of the first film relative to that of the second film, wherein the interface is between a vertical section of the first film and a vertical section the second film, relative to the article surface.

13. The article of claim 12, wherein the surface of the article is at least a portion of an aerospace vehicle.

* * * * *